United States Patent [19]
White et al.

[11] Patent Number: 4,600,449
[45] Date of Patent: Jul. 15, 1986

[54] TITANIUM ALLOY (15V-3CR-3SN-3AL) FOR AIRCRAFT DATA RECORDER

[75] Inventors: Kenneth W. White, Issaquah; William F. Spurr, Kirkland, both of Wash.

[73] Assignee: Sundstrand Data Control, Inc., Redmond, Wash.

[21] Appl. No.: 572,228

[22] Filed: Jan. 19, 1984

[51] Int. Cl.$^4$ .......................... C22F 1/18; C22C 14/00
[52] U.S. Cl. ................. 148/407; 148/12.7 B; 148/421
[58] Field of Search ................. 420/418–420; 148/407, 421, 11.5 F, 12.7 B

[56] References Cited

U.S. PATENT DOCUMENTS

| Re. 26,907 | 6/1970 | Doyle et al. | 420/535 |
|---|---|---|---|
| 2,522,575 | 9/1950 | Hall et al. | 148/417 |
| 2,754,204 | 7/1956 | Jaffee et al. | 420/418 |
| 2,892,705 | 6/1959 | Jaffee et al. | 420/417 |
| 2,968,586 | 1/1961 | Vordahl | 148/421 |
| 3,172,790 | 3/1965 | Gilmore et al. | 148/417 |
| 3,414,406 | 12/1968 | Doyle et al. | 420/535 |
| 3,444,009 | 5/1969 | Evans | 148/12.7 B |
| 3,595,645 | 7/1971 | Hunter et al. | 420/420 |
| 3,673,007 | 6/1972 | Miyano et al. | 148/12 F |
| 3,748,194 | 7/1973 | Ruckle et al. | 148/405 |
| 3,895,940 | 7/1975 | Bieber | 75/128 W |
| 3,901,743 | 8/1975 | Sprague et al. | 148/407 |
| 3,994,754 | 11/1976 | Geymond | 148/36 |
| 4,292,077 | 9/1981 | Blackburn et al. | 420/418 |

FOREIGN PATENT DOCUMENTS 675383 12/1963 Canada .................. 148/12.7 B

OTHER PUBLICATIONS

"Grain-Boundary Deformation Behavior in a Metastable Beta-Titanium Alloy", J. of Materials Science, Jul. 1981, pp. 2031–2035.
Reinsch et al, "Three Recent Developments in Titanium Alloys", Metal Progress, Mar. 1980, pp. 64–70.
Practical Considerations for Manufacturing High-Strength Ti–10V–2Fe–3Al Alloy Forgings, C. C. Chen & R. R. Boyer–Journal of Metals, vol. 31, No. 7, 7/1979, pp. 33–39.
Annealing Study of 6Al–4V–2Co Titanium Alloy, R. E. Curtis, pp. 15–49.
Boeing Design Manual, 140.1, 2/14/64.
Timet Data Sheet, 11/1/82.

Primary Examiner—Peter K. Skiff
Attorney, Agent, or Firm—Christensen, O'Connor, Johnson & Kindness

[57] ABSTRACT

An aircraft flight data recorder housing comprising a titanium alloy having a nominal composition of 15 weight percent vanadium, 3 weight percent chromium, 3 weight percent tin, and 3 weight percent aluminum with the balance being titanium and, within limitations, certain trace elements. The alloy is simultaneously hot formed and solution heat treated at temperatures on the order of 1400° F. to 1500° F. to fabricate the recorder housing.

14 Claims, 1 Drawing Figure

TITANIUM ALLOY (15V-3CR-3SN-3AL) FOR AIRCRAFT DATA RECORDER

BACKGROUND OF THE INVENTION

The present invention relates to titanium alloys and more particularly to a novel and unique titanium alloy that exhibits high strength and fracture toughness for use in aircraft flight data recorders.

Although there are numerous situations in which it is necessary or desirable to protect a device form deleterious exposure to a crash environment, shielding the memory device of an aircraft flight recorder system during crash presents extremely demanding design constraints. In this regard, in order to preserve flight data supplied to the memory unit of a flight data recorder during a predetermined time interval immediately prior to an aircraft crash, the memory unit must be constructed to endure crushing and penetration forces experienced either as the aircraft impacts the ground or as a result of secondary impacts with other portions or pieces of the aircraft. Furthermore, the memory unit of a flight data recorder system is subject to additional design constraints imposed by considerations generally applicable to aircraft equipment and systems, including constraints relating to size, weight, cost, serviceability and reliability.

Prior flight data recorders have been encased in stainless steel housings that are capable of withstanding very high crushing and penetration forces. Stainless steel, however, is relatively heavy when compared to other lightweight metals. Heretofore, other lightweight materials such as titanium alloys used on flight data recorders have not achieved desired weight reduction because they lacked the required blend of strength, ductility, and fracture toughness to resist penetration during a crash.

SUMMARY OF THE INVENTION

In accordance with the present invention, a unique titanium alloy is provided for use in housing of a flight data recorder. The titanium alloy formulated and processed in accordance with the present invention provides a flight data recorder housing that is not only as resistant to penetration as prior art stainless steel, but also exhibits sufficient fracture toughness to resist shattering or extensive cracking during a crash. In its preferred form, the titanium alloy consists essentially of:

| Element | Weight percent (wt. %) |
| --- | --- |
| V | 14 to 16 |
| Cr | 2.5 to 3.5 |
| Sn | 2.5 to 3.5 |
| Al | 2.5 to 3.5 |
| $O_2$ | 0.13 max |
| $N_2$ | 0.03 max |
| C | 0.03 max |
| $H_2$ | 0.015 max |
| Fe | 0.30 max |
| Y | 0.005 max |
| Residual elements, each | 0.10 max |
| Residual elements, total | 0.30 max |
| Ti | Balance. |

The alloy is conventionally formulated, melted, forged, and hot and cold rolled into sheet stock. The sheet stock is then simultaneously formed and solution heat treated to produce an article such as a flight recorder housing. Formulating and processing the titanium alloy in accordance with the present invention provides an alloy that is characterized by a fine grained, recrystallized mircostructure, which surprisingly provides the alloy with a very high fracture toughness while not detracting from its high strength.

DETAILED DESCRIPTION OF THE INVENTION

Figure 1:
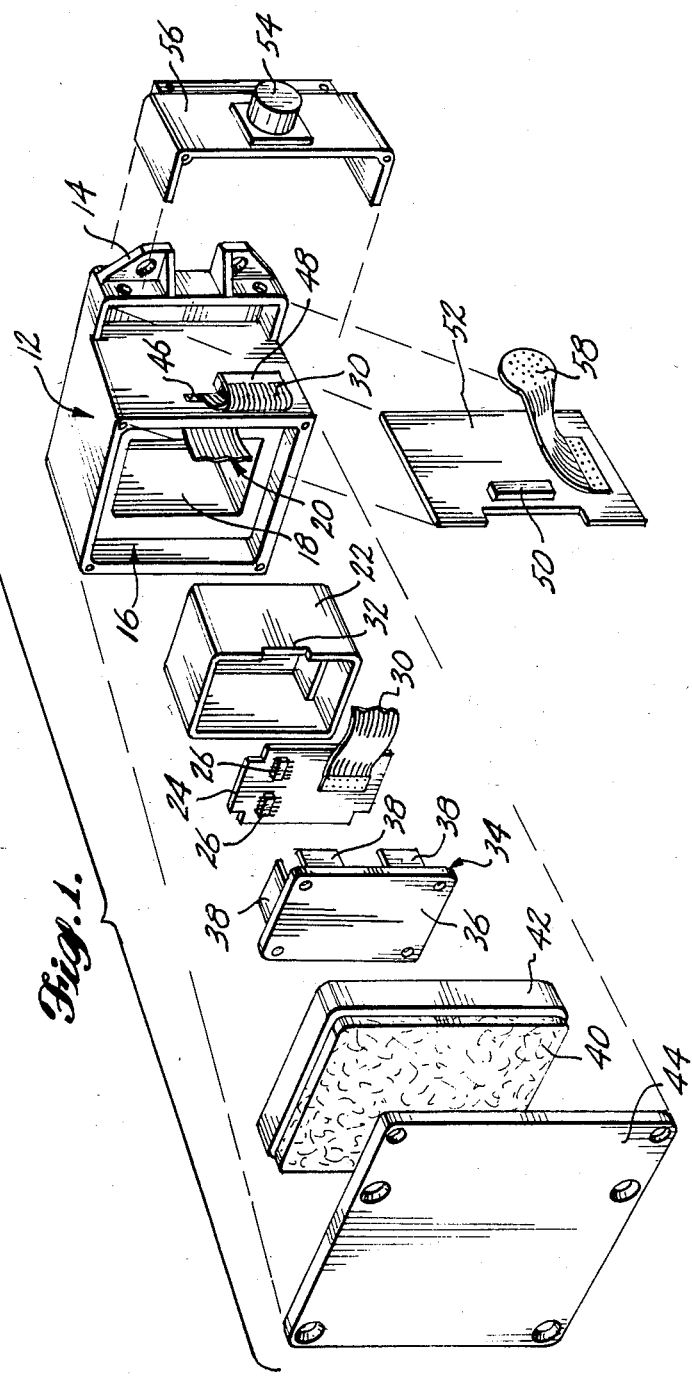

A thermally protected flight data recorder system memory unit configured in accordance with this invention is illustrated in FIG. 1 and is generally denoted herein by the reference numeral 10. As is known in the art, such a memory unit is configured to provide a record of various important aircraft performance parameters over a predetermined time interval that occurs immediately prior to each time the flight data recorder is deactivated (including deactivation which occurs if the aircraft crashes). In operation, the information stored within the memory unit is ongoingly supplied by additional components of the flight data recorder system such as a data acquisition unit that receives input signals from various aircraft sensors and systems and processes those signals to produce signals compatible with the recording or storage medium employed by the flight data recorder memory unit. In the case of the disclosed embodiment of the invention, which utilizes a solid state electronic device such as electronically erasable programmable read only memory circuits as the information storage medium, the data acquisition unit periodically supplies digital signals which are sequentially written into the semiconductor memory circuits so that the memory circuits store a sequence of digital words that is a time sampled data representation of the history for each parameter being monitored. Typically, with respect to currently employed techniques, data compression is generally employed to allow storing digital signals representative of a 15-30 minute time history for each monitored parameter.

As is shown in FIG. 1, the present embodiment of the flight data recorder system memory unit of this invention includes an outer housing 12 that is substantially rectangular in cross section when viewed perpendicular to each of its major axes. Flanges 14 extend orthogonally from oppositely disposed edges of the base of outer housing 12 to facilitate mounting memory unit 10 at a convenient location within the aircraft by means of bolts or other conventional fasteners. A substantially rectangular cavity 16 extends inwardly from one face of outer housing 12 toward the base of memory unit 10 so that the major portion of outer housing 12 is configured as a substantially rectangular shell. Outer housing 12 is constructed of a titanium alloy that exhibits relatively low density and very high resistance to crushing and penetration with the wall regions that are defined between cavity 16 and the outer surfaces of outer housing 12 being dimensioned to withstand crushing and penetration should the aircraft crash. The titanium alloy utilized in accordance with the present invention is formulated and processed so as to provide it with unique and superior characteristics that make it especially adaptable for use as a flight recorder housing. An intumescent coating or paint is applied to the outer surfaces of outer housing 12 to provide thermal insulation during the initial phases of a fire.

A shell-like thermal liner 18, nested within cavity 16 of outer shell 12, provides a first thermal barrier for shielding components that are located in the interior regions of memory unit 10 from high temperature fires that may occur during such an aircraft crash. Thermal liner 18 is substantially rectangular in cross-sectional geometry relative to each of its major axes and forms an inwardly extending cavity 20 that is coaxially positioned within cavity 16 of outer housing 12. Thermal liner 18 is preferably a unitary structure that is formed of a solid material that is a good thermal insulator.

As is illustrated by FIG. 1, a relatively thin walled central shell 22 that nests within cavity 20 receives and contains one or more printed circuit boards 24 that provide physical support for an electrical innerconnection for a number of solid state memory devices 26. Although the arrangement of FIG. 1 depicts a conventional printed circuit arrangement wherein each solid state memory device is encapsulated to form what is known as a dual in-line package, other configurations can be employed. For example, in some realizations of the invention it may be advantageous to bond semiconductor chips that contain circuitry for a number of electronically erasable programmable read only memories directly to a ceramic substrate or other carrier that includes electrical innerconnections that are vacuum deposited or otherwise formed thereon. In any case, central shell 22 is preferably formed from a material such as stainless steel or another metal that presents a reasonable density-heat capacity trade off (i.e., the product of material density times heat capacity is relatively high) and that also is easily worked or formed. Further, each printed circuit board 24 is mounted within central shell 22 so that each solid state memory device 26 is spaced apart from the inner surfaces of central shell 22.

To provide a high degree of heat shielding, the open regions between the inner walls of central shell 22, printed circuit board 24 and adjacent solid state memories 26 are filled by a meltable insulator that exhibits a solid-liquid phase transition at or below the desired temperature limit for solid state memories 26. Such a material is characterized by a first temperature range wherein heat energy supplied to the material first results in a linear increase in material temperature and is followed by a relatively constant temperature region wherein the heat energy supplied is consumed by the heat of fusion of the material, causing the material to melt. A continued supply of heat energy to such a material after it reaches the molten state generally will cause the material temperature to rise to the boiling point of the material. When additional heat energy is supplied, no further temperature increase is experienced until the material is vaporized. This latter characteristic is of importance only in that the meltable insulator 28 that is employed in the practice of the invention is selected so that little or no vaporization occurs when memory unit 10 of FIG. 1 is subjected to a high temperature environment associated with a burning aircraft.

Referring again to FIG. 1 and the physical configuration of memory unit 10, electrical connection to printed circuit board 24 is provided by means of a flexible, flat cable assembly 30 that is constructed of a polyimide ribbon or other such material that includes a series of spaced apart conductive strips. When printed circuit board 24 is placed in central shell 22, cable 30 extends through a rectangular notch 32 that is formed in one boundary edge of central shell 22.

Thermal isolation for the face of central shell 22 that is defined by cover assembly 34 is provided by a substantially rectangular thermal insulator 40 that is constructed of the same material utilized in forming thermal liner 16. As is shown in FIG. 1, thermal insulator 40 preferably is covered with a fiberglass reinforced resin 42 (or other durable material) to protect thermal insulator 40.

A second substantially rectangular cover plate 44 that is constructed of the same titanium alloy as outer housing 12 covers the open face of outer housing 12 so as to fully enclose memory unit 10 in a manner that substantially seals the unit and provides substantially identical thermal conductance relative to heat energy that is coupled through each rectangular face of memory unit 10.

With particular reference to FIG. 1, electrical cable 30 exits cavity 16 of outer housing 12 through a rectangular slot 46 that is formed in one wall of outer housing 12. A connector 48 at the outward terminus of cable 30 mates with a connector 50 that is located on a printed circuit board 52. In the depicted embodiment, printed circuit board 52 is mounted substantially parallel to the face of outer housing 12 that includes slot 46 and contains conventional electronic interface or control circuitry (not shown in FIG. 1) for sequentially addressing solid state memory devices 26 during operation of the flight data recorder system. Although this control circuitry need not survive a fire in order to preserve the data stored in solid state memory devices 26, it is preferably mounted within memory unit 10 in order to eliminate data errors that might otherwise be caused by electromagnetic interference and various other signal transients encountered in aircraft electrical systems.

To complete memory unit 10 and provide electrical connection between the system data acquisition unit and printed circuit board 52, memory unit 10 includes an electrical connector 54 that passes through the major face of a substantially U-shaped flange 56. As is indicated in FIG. 1, flange 56 is mounted to outer housing 12 with connector 54 spaced apart from circuit board 52. A suitably configured ribbon-type cable assembly 58 provides electrical interconnection between connector 54 and printed circuit board 52.

The titanium alloy formulated in accordance with the present invention has a nominal composition comprising 15 percent vanadium, 3 percent chromium, 3 percent tin, 3 percent aluminum, with the balance being titanium and various trace elements and impurities. All percentages utilized herein are weight percent based on the total alloy. In its most preferred form, the titanium alloy has the following composition:

| Element | Weight percent (wt. %) |
| --- | --- |
| V | 14 to 16 |
| Cr | 2.5 to 3.5 |
| Sn | 2.5 to 3.5 |
| Al | 2.5 to 3.5 |
| $O_2$ | 0.13 max |
| $N_2$ | 0.03 max |
| C | 0.03 max |
| $H_2$ | 0.015 max |
| Fe | 0.30 max |
| Y | 0.005 max |
| Residual elements, each | 0.10 max |
| Residual elements, total | 0.30 max |
| Ti | Balance. |

It is especially important that the trace elements oxygen, nitrogen, carbon, hydrogen and iron be maintained at or below the maximums indicated in the foregoing table. Any alloy of the foregoing composition is available from Timet, 400 Rouser Road, Pittsburgh, PA 15230.

Prior to processing in accordance with the present invention, the manufacturer of the alloy will formulate an alloy in accordance with the nominal composition, keeping in mind the maximums listed above for the various trace elements. The alloy is usually cast into an ingot having a length of about 6 feet and a diameter of about 28 inches at relatively high temperatures. The ingot is then forged to a rolling bar stock having a thickness of about 4 to 5 inches, a width of about 36 to 42 inches and a length of 6 to 8 feet. The rolling bar stock is then heated to a temperature generally on the order of 1750° F. to 1950° F. and run through a multistand rolling mill of the type normally utilized for stainless steel. The bar is rolled to a final thickness on the order of 0.180 to 0.200 inch and then wrapped into a coil. The material is then surface conditioned by grinding and etching, and cold rolled in a "Z-mill" where its thickness is further reduced on the order of 30 to 50 percent. The material is then annealed at a temperature on the order of 1450° F. The cold rolling and annealing is repeated until a sheet of the desired thickness is achieved. For purposes of the present invention, the sheet thickness can be on the order of 0.100 to 0.150 inch. After the final cold roll, the sheet is solution annealed for about 4 minutes at a temperature on the order of 1450° F., after which it is cooled in a vacuum tower at a relatively rapid pace. The material can be aged at this time, but in accordance with the present invention, is preferably aged after final forming.

Thereafter, in accordance with the present invention, the material is simultaneously solution treated and hot formed. Prior alloys of this type have conventionally been cold formed. In accordance with the present invention, the sheet is hot formed at temperatures ranging from 1400° F. to 1500° F. The formed article is maintained at these temperatures for on the order of approximately 5 minutes. The article is then air cooled at a rate sufficiently rapid to assure that the alloy remains in the solution treated condition. Sometimes, it is necessary to restrain the article during cooling to maintain dimensions. This hot forming and cooling operation is unique in that the dimensional accuracy is maintained after forming without the use of an elevated temperature sizing step. In accordance with the present invention, the alloy is then preferably aged at temperatures on the order of 900° F. to 1000° F. for a period ranging from 6 to 16 hours, preferably on the order of 8 hours. Aging in this manner can result in a titanium alloy having a strength on the order of 180 to 210 ksi. It is very important, in fact critical, however, that the alloy only be aged to strength levels no greater than about 200 ksi. If the material is aged to higher strength levels, the fracture toughness and other desirable properties will tend to fall off and the resulting material will not be suitable for use as a flight data recorder housing. Similarly, if the material is aged to strength levels below 165 ksi, penetration resistance will tend to fall off.

Formulating and processing a titanium alloy in accordance with the present invention will result in an alloy exhibiting a fine grained, recrystallized microstructure. It is preferred that the grain size be on the order of finer than about 3 ASTM grain size units and preferably finer than 5 ASTM grain size units. It has been found, however, that an alloy having an average grain size of about 5 ASTM grain size units will have sufficiently high strength, fracture toughness and penetration resistance to function acceptably as a flight data recorder housing.

The following examples are intended to illustrate to one of ordinary skill how to make and use the present invention. The examples are not intended in any way to limit the scope of the Letters Patent granted hereon.

EXAMPLE I

A titanium alloy was forumulated having a nominal composition of 15 percent vanadium, 3 percent chromium, 3 percent tin and 3 percent aluminum. The balance was titanium with the trace elements being maintained within the maximum level set forth for the preferred composition above. The material was forged, hot rolled, surface conditioned and cold rolled to a final thickness of 0.110 inch with annealing in accordance with the procedure set forth above after each cold roll pass.

A first specimen was cut from the sheet and was machined to a thickness of 0.100 inch. The specimen was solution annealed at 1450° F., air cooled, and then aged at 900° F. for 14 hours. The specimen was then air cooled. The first specimen had an ultimate tensile strength of 205 ksi. The specimen plate, having a square side of about 5 inches, was then bolted in an aluminum frame exposing a central portion of about 4 inches square. The frame was placed on a bed of sand having a depth of 18 inches and length and width of 48 inches. A 500 pound penetration weight was then elevated 10 feet above the plate. The bottom of the penetration weight carried a vertically oriented steel pin having a length of 2½ inches and a ¼ inch diameter and rockwell harness of about C 40. When the penetration weight was released and allowed to gravitate toward the exposed specimen, the steel pin penetrated the specimen, causing it to tear and crack.

A second specimen 0.110 inch thick was cut from the sheet stock and solution annealed as was the first specimen. The second specimen was aged at 875° F. for 18 hours and air cooled. The specimen had an ultimate tensile strength of 210 ksi. When subjected to the penetration test, the specimen failed by cracking.

EXAMPLE II

A titanium alloy was formulated having a nominal composition of 15 percent vanadium, 3 percent chromium, 3 percent tin and 3 percent aluminum. The balance was titanium with the trace elements being maintained within the maximum level set forth for the preferred composition above. The material was forged, hot rolled, surface conditioned and cold rolled to a final thickness of 0.110 inch with annealing in accordance with the procedure set forth above after each cold roll pass.

Thereafter, the sheet stock was hot formed into a flight data recorder housing configured similarly to the housing 12 in FIG. 1 at a temperature of about 1450° F. The housing was maintained at this temperature for a period of about 5 minutes. The housing was then air cooled to room temperature. The housing was then reheated to a temperature of about 950° F. and aged for a period of 8 hours. The material had an ultimate tensile strength between 180 ksi and 190 ksi. Thereafter, the housing was subjected to testing in accordance with the following procedure.

The housing was placed on a bed of sand having a depth of 18 inches and length and width of 48 inches. The bottom of the housing was placed upwardly from and parallel with the surface of the sand. A 500 pound penetration weight was then elevated 10 feet above the plate. The bottom of the penetration weight carried a vertically oriented steel pin having a length of 2½ inches and a ¼ inch diameter and rockwell hardness of about C 40. When the penetration weight was released and allowed to gravitate toward the bottom of the housing, the steel pin contacted but did not penetrate the housing. Lack of penetration by the penetration pin indicates that the titanium alloy has an appropriate blend of strength, fracture toughness and penetration resistance to function as a flight data recorder housing.

The present invention has been described broadly and in relation to its preferred embodiments. One of ordinary skill will be able to effect various changes, substitutions of equivalents, and other alterations without departing from the broad concepts disclosed herein. It is, therefore, intended that the protection granted by Letters Patent hereon be limited only by the definition contained in the appended claims and equivalents thereof.

The embodiments of the invention in which an exclusive property or privilege is claimed are defined as follows:

1. A flight data recorder housing comprising a titanium alloy consisting essentially of

| Element | Weight percent (wt. %) |
| --- | --- |
| V | 14 to 16 |
| Cr | 2.5 to 3.5 |
| Sn | 2.5 to 3.5 |
| Al | 2.5 to 3.5 |
| $O_2$ | 0.13 max |
| $N_2$ | 0.03 max |
| C | 0.03 max |
| $H_2$ | 0.015 max |
| Fe | 0.30 max |
| Y | 0.005 max |
| Residual elements, each | 0.10 max |
| Residual elements, total | 0.30 max |
| Ti | Balance, | said housing having been simultaneously formed and solution heat treated at an elevated temperature, said alloy having been aged to an ultimate tensile strength less than 200 ksi.

2. The flight data recorder of claim 1 wherein said housing is formed at elevated temperatures from sheet stock.

3. The flight data recorder housing of claim 1 wherein said elevated temperature is in the range of from the beta transus temperature of the alloy to 1500° F.

4. The flight data recorder housing of claim 3 wherein the average grain size of said alloy is finer than about 3 ASTM grain size units.

5. The flight data recorder housing of claim 4 wherein the average grain size of said alloy is finer than about 5 ASTM grain size units.

6. The flight data recorder of claim 1 wherein said alloy has been aged to an ultimate tensile strength of between 165 and 200 ksi.

7. The flight data recorder of claim 6 wherein said alloy has been aged to an ultimate tensile strength of between 180 and 200 ksi.

8. A method for preparing a flight data recorder housing comprising a titanium alloy exhibiting high strength and fracture toughness wherein said alloy consists essentially of

| Element | Weight percent (wt. %) |
| --- | --- |
| V | 14 to 16 |
| Cr | 2.5 to 3.5 |
| Sn | 2.5 to 3.5 |
| Al | 2.5 to 3.5 |
| $O_2$ | 0.13 max |
| $N_2$ | 0.03 max |
| C | 0.03 max |
| $H_2$ | 0.015 max |
| Fe | 0.30 max |
| Y | 0.005 max |
| Residual elements, each | 0.10 max |
| Residual elements, total | 0.30 max |
| Ti | Balance, | said method comprising the steps of:
a. formulating said alloy and creating an ingot,
b. forging said ingot and rolling sheet stock therefrom,
c. simultaneously solution treating and forming a flight data recorder housing from said sheet stock at an elevated temperature, and
d. aging said alloy to an ultimate tensile strength level less than 200 ksi.

9. The method of claim 8 wherein said forming is conducted at a temperature at a range of from the beta transus temperature of the alloy to 1500° F.

10. The method of claim 9 wherein the average grain size of said alloy is finer than about 3 ASTM grain size units.

11. The method of claim 10 wherein the average grain size of said alloy is finer than about 5 ASTM grain size units.

12. The method of claim 9 wherein said flight data recorder housing is maintained at said elevated temperature for a period ranging from 3 to 30 minutes.

13. The method of claim 8, wherein said alloy is aged to an ultimate tensile strength level of between 165 and 200 ksi.

14. The method of claim 13, wherein said alloy is aged to an ultimate tensile strength level of between 180 and 200 ksi.

* * * * *

UNITED STATES PATENT AND TRADEMARK OFFICE
CERTIFICATE OF CORRECTION

PATENT NO. : 4,600,449

DATED : July 15, 1986

INVENTOR(S) : Kenneth W. White et al.

It is certified that error appears in the above-identified patent and that said Letters Patent is hereby corrected as shown below:

Column 2, lines 3 & 4, "mircostructure" should be --microstructure--
Column 4, line 3, "16" should be --18--

Signed and Sealed this

Fourth Day of November, 1986

[SEAL]

*Attest:*

DONALD J. QUIGG

*Attesting Officer*  *Commissioner of Patents and Trademarks*